United States Patent
Akbari-Dilmaghani

(10) Patent No.: US 11,070,170 B2
(45) Date of Patent: Jul. 20, 2021

(54) OSCILLATOR CIRCUIT ARRANGEMENT

(71) Applicant: ams AG, Premstaetten (AT)

(72) Inventor: Rahim Akbari-Dilmaghani, Graz (AT)

(73) Assignee: ams AG, Premstaetten (AT)

(*) Notice: Subject to any disclaimer, the term of this patent is extended or adjusted under 35 U.S.C. 154(b) by 0 days.

(21) Appl. No.: 16/771,616

(22) PCT Filed: Dec. 5, 2018

(86) PCT No.: PCT/EP2018/083674
§ 371 (c)(1),
(2) Date: Jun. 10, 2020

(87) PCT Pub. No.: WO2019/115316
PCT Pub. Date: Jun. 20, 2019

(65) Prior Publication Data
US 2020/0373884 A1   Nov. 26, 2020

(30) Foreign Application Priority Data

Dec. 13, 2017  (EP) ..................................... 17207021

(51) Int. Cl.
*H03B 5/36* (2006.01)
*H03K 3/354* (2006.01)

(52) U.S. Cl.
CPC ........... *H03B 5/364* (2013.01); *H03K 3/3545* (2013.01); *H03B 2200/0012* (2013.01); *H03B 2200/0094* (2013.01)

(58) Field of Classification Search
CPC ............ H03B 5/364; H03B 2200/0012; H03B 2200/0094; H03K 3/3545; H03K 3/014; H03K 3/013
See application file for complete search history.

(56) References Cited

U.S. PATENT DOCUMENTS

| | | |
|---|---|---|
| 5,113,156 A | 5/1992 | Mahabadi et al. |
| 5,545,941 A | 8/1996 | Soneda et al. |
| 2003/0071695 A1 | 4/2003 | Sekimoto |
| 2015/0061786 A1* | 3/2015 | Mai .......................... H03B 5/06 331/116 FE |
| 2018/0109264 A1* | 4/2018 | Kim ....................... H03B 5/364 |

OTHER PUBLICATIONS

Rowell, A.J. et al., "Development of Improved Test Methods for Assessing the EMC Emissions from Luminaires and Ancillary Devices AY4125", York EMC Services Ltd., Second Issue Minor Modifications Mar. 26, 2002, 136 pages.

(Continued)

*Primary Examiner* — Jeffrey M Shin
(74) *Attorney, Agent, or Firm* — MH2 Technology Law Group LLP

(57) ABSTRACT

An oscillator circuit arrangement comprises an inverter having input and output terminals that are to be connected to a crystal device. An automatic gain control device controls a current source that supplies current to the inverter. First and second diode devices having different orientation are connected between the input and the output of the inverter. The oscillator consumes low power and has a fast recovery time after an electromagnetic interference event. The oscillator can be used in electronic labels.

28 Claims, 2 Drawing Sheets

(56) References Cited

OTHER PUBLICATIONS

Agrawal, D.K. et al, "Modeling nonlinearities in MEMS oscillators", IEEE Trans. Ultrason. Ferroelectr. Freq. Control 60:8; Aug. 2, 2013; p. 1646-1659.
Sekar, V. et al., "An Efficient Technique for EMI Mitigation in Fluorescent Lamps using Frequency Modulation and Evolutionary Programming", World Academy of Science, Engineering and Technology; Int'l. J. Electrical and Computer Engineering, vol. 4, No. 1, (2010), pp. 120-126.
Thommen, W., "An improved low power crystal oscillator", Solid-State Circuits Conference, 1999. ESSCIRC '99, the 25th European, IEEE, 1999; p. 146-149.
Vittoz, E. et al., "CMOS analog circuits based on weak inversion operation", IEEE J. Solid-State Circuits vol. SC-12, No. 3, Jun. 1977, pp. 224-231.
Vittoz, E. et al., "High-performance crystal oscillator circuits: theory and application", IEEE J. Solid State Circuits, vol. 23, No. 3, Jun. 1988, pp. 774-783.
Yao, S. et al., "Design of Low Power CMOS Crystal Oscillator with Tuning Capacitors", Engineering Letters; 14:1(8), Feb. 12, 2007.
European Patent Office, International Search Report for PCT/EP2018/083674 dated Feb. 11, 2019.

\* cited by examiner

OSCILLATOR CIRCUIT ARRANGEMENT

CROSS-REFERENCE TO RELATED APPLICATIONS

The present application is the national stage entry of International Patent Application No. PCT/EP2018/083674, filed on Dec. 5, 2018, which claims benefit of priority of European Patent Application No. 17207021.1, filed on Dec. 13, 2017, all of which are hereby incorporated by reference in their entirety for all purposes.

BACKGROUND

The present disclosure relates to an oscillator circuit arrangement for low power applications. Specifically, the present disclosure relates to an oscillator circuit arrangement that comprises an inverter to be connected to a crystal device and an automatic gain control device controlling the supply current for the inverter. The present disclosure also relates to the application of the oscillator circuit arrangement in an electronic label.

Oscillators are widely used to provide clock signals to control operation of electronic devices. Oscillators may be implemented by way of an integrated circuit on a semiconductor chip with external elements such as a crystal to provide a time base and capacitors to provide proper phase shift of the signals.

An oscillator according to the Pierce architecture may be used, for example, in the field of electronic label or electronic paper applications where power consumption is crucial. On the other hand, electronic shelf labels may operate in an environment where electromagnetic interference (EMI) is present. Modern electronic ballast circuits of fluorescent lighting systems typically operate in the range of about 20 KHz and more so that they may interfere with low power oscillators operating in a similar frequency range. Because the oscillators for electronic label applications are designed to consume as little power as possible, an EMI event can disturb the operation of the oscillator. For example, high frequency ballast circuits generate fast transients that may couple a strong noise into the oscillator so that the oscillation can drift from its ideal operation. The oscillation may stop for a certain amount of time and recover later or, in the worst case, oscillation may be completely lost and may not recover by itself. The display of information in an electronic shelf label could therefore be disturbed by EMI or the label could be disturbed such that it stops operation.

There is a need to provide an oscillator that is more robust against electromagnetic interference and recovers quickly after a strong EMI event. The oscillator should nevertheless be simple in construction and require little area when realized in an integrated circuit. The power consumption of the oscillator must be kept at a low level.

SUMMARY

In an embodiment, an oscillator circuit arrangement comprises an inverter having an input terminal and an output terminal to be connected to a crystal device and having a supply terminal; an automatic gain control device connected to the output terminal of the inverter and connected to a controllable current source that is connected to the supply terminal of the inverter; first and second diode devices having different orientation and connected between the input and the output of the inverter.

The oscillator comprises first and second diode devices of different orientation connected between the input and the output of the inverter. The diode devices may be connected in antiparallel fashion. When realized as diode-connected MOS transistors, the gate and drain terminals are connected together. The gate and drain terminals of one of the diodes may be connected to the output of the inverter and the source terminal of that diode may be connected to the input of the inverter. The drain and source terminals of the other diode may be connected to the input of the inverter and the source terminal may be connected to the output of the inverter. These diodes oppose a big voltage change that occurs at the input or the output of the oscillator and therefore provide a fast stabilization of the output signal voltage if an interference signal is removed. The diodes provide a forward biased voltage to the input and output of the oscillator and clamp these terminals in a start-up situation. In normal, steady state mode of the oscillator, the diodes are substantially back-biased. The diodes draw only a current in the exceptional situation of start-up after an EMI event and are substantially switched off during normal operation.

An electronic shelf label that incorporates the oscillator may have enough refresh delay so that the oscillator can recover its oscillation before the next display refresh, even after a complete loss of oscillation in the case of an EMI event so that the loss of oscillation will not be recognized by a person looking onto the display.

According to an embodiment, the oscillator may comprise a controllable resistor that is connected between the input and the output of the inverter. The controllable resistor has a higher resistance in the transient time, for example, during startup and a lower resistance in normal mode so that the inverter has a higher gain during the ramp-up phase. A separate current path that controls the controllable resistor includes a controllable current source that is controlled by the automatic gain control (AGC) device. The separate current path may include a resistive element that is connected between the controllable current source and ground potential. Specifically, the resistive element may comprise the series connection of a first and a second diode device. The separate current path therefore resembles the conditions in the current path of the inverter.

According to yet another embodiment of the present disclosure, a third diode device may be provided that is connected between the first and second diode devices of the resistive element of the separate current path and the output of the inverter. The third diode device has a similar effect to the first and second oppositely connected diode devices in that it opposes a big voltage change in the output node and provides a fast stabilization of the output signal in the case of an EMI event.

The oscillator circuit may be realized in CMOS technology so that all diode devices are realized by MOS transistors of which the drain and gate terminals are connected together. The oppositely connected first and second diode devices and the third diode device may be n-channel MOS transistors. The controllable resistor that is connected between input and output of the inverter may also be a n-channel MOS transistor. The controllable current sources of the inverter and of the separate current path may be p-channel MOS transistors whose gate terminal is connected to the output of the AGC device. The source terminals of the p-channel MOS transistors are connected to a positive supply potential. The realization of the circuit with CMOS technology allows a design that requires only little supply power. The additional diodes that enable a fast start-up time are only active during the transient phase and are off during normal operation so that they require no additional power during normal operation.

The automatic gain control (AGC) device includes circuitry that generates a high gain during the startup or transient operational phase of the oscillator and has a low gain in the normal or steady state operational phase. The AGC device controls the conductivity state of the controllable current sources and causes them to supply more current during the transient phase and only as low as possible current during the steady state phase.

According to another aspect of the present disclosure, an electronic label device comprises a display device and the oscillator circuit arrangement as mentioned above. The oscillator circuit arrangement provides a clock signal to control display of information on the display device.

The display screen of the electronic label requires a refresh operation that is controlled by the oscillator. Because the oscillator circuit arrangement has an accelerated start-up time, the oscillator may recover oscillation even after a loss of oscillation in response to an EMI event within the refresh interval before the next refresh operation is necessary. A person who watches the display will not recognize an interruption. All this is achieved with only very few extra elements in the integrated circuit while still fulfilling the requirement of very low power consumption.

Additional features and advantages will be set forth in the detailed description which follows and in part will be readily apparent to those skilled in the art from the description or recognised by practising the embodiments as described in the written description and claims hereof as well as the appended drawings.

The accompanying drawings are included to provide a further understanding and are incorporated in and constitute a part of the disclosure. The drawings illustrate one or more embodiments, and together with the description serve to explain principles and operation of the various embodiments. The same elements in different Figures are denoted by the same reference signs.

DETAILED DESCRIPTION

Figure 1:
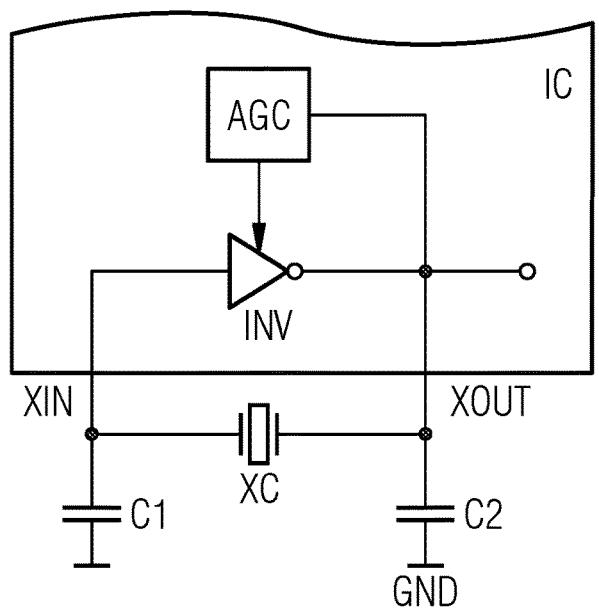
FIG. 1 shows a principle circuit representation of a common Pierce oscillator.

It is to be understood that both the foregoing general description and the following detailed description are merely exemplary and are intended to provide an overview or framework to understand the nature and character of the claims. The present disclosure will now be described more fully herein with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure. Same elements in different drawings are denoted by the same reference numerals.

FIG. 1 shows the principle diagram of a common oscillator. An inverter INV is disposed on an integrated circuit IC. The input and the output of the inverter are connected to an external quartz crystal XC that forms a time basis for the oscillation of the circuit. The input and the output of the inverter are furthermore coupled to ground via two capacitors C1, C2. The crystal and the capacitors are external to the integrated circuit IC while the inverter and other components are integrated on the integrated circuit IC. The output signal of the inverter INV is monitored by an automatic gain control device AGC that controls the amplitude of the oscillation by a feedback loop. The AGC has a high amplification factor $g_m$ during a transitional phase of operation of the oscillator. During the normal or steady state phase of the oscillator, the amplification factor $g_m$ is low and the loop gain is close to unity. The architecture of the oscillator as shown in FIG. 1 is the so-called Pierce oscillator circuit.

Figure 2:
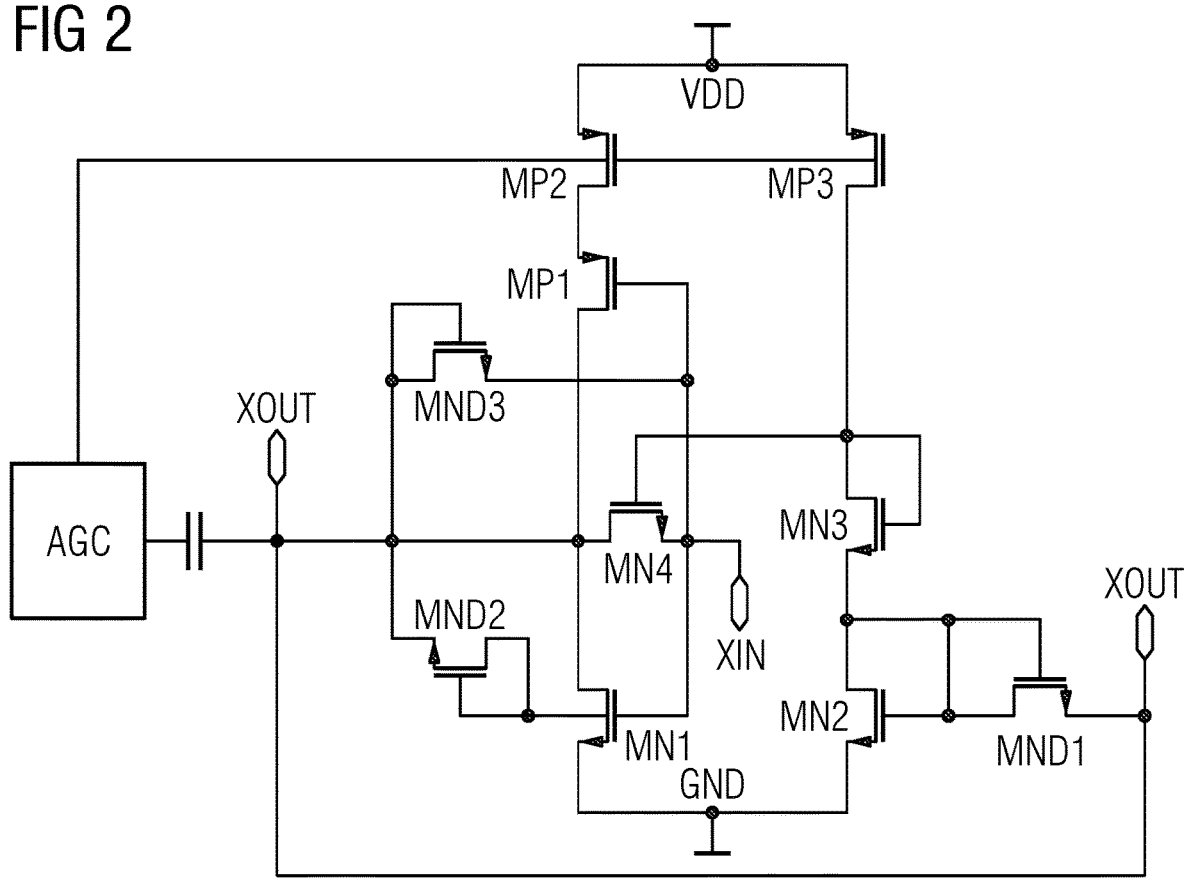
FIG. 2 shows a detailed circuit diagram of an oscillator circuit arrangement according to this disclosure.

FIG. 2 shows a detailed circuit diagram of an oscillator according to the Pierce architecture that includes improvements to resolve the objects explained above. The oscillator circuit comprises an inverter composed of p-channel MOS transistor MP1 and n-channel MOS transistor MN1 having series-connected drain-source paths. The output XOUT of the inverter is sensed by an automatic gain control circuit AGC that controls a controllable current source realized by p-channel MOS transistor MP2. The drain terminal of transistor MP2 is connected to the source terminal of transistor MP1 of the inverter which is the supply terminal of the inverter. The external crystal XC and the capacitors C1, C2 (not shown in FIG. 2) are to be connected between the input and output terminals XIN, XOUT of the inverter. Depending on the amplitude of the output signal at XOUT, the AGC circuit controls the current to be delivered by controllable current source MP2.

A separate current path comprises another controllable current source realized by p-channel MOS transistor MP3. The gate of transistor MP3 is also connected to the output of the AGC circuit and is connected parallel to the gate of controllable current source MP2. The drain of transistor MP3 is connected through a resistive element to ground potential GND. The resistive element comprises the series connection of two MOS diode devices MN3, MN2. The current through the separate current path MP3, MN3, MN2 has the same control and the same transient behaviour as the current through the inverter current paths MP2, MP1, MN1.

A controllable resistor in the form of n-channel MOS transistor MN4 is connected between the output and the input of the inverter. The drain terminal MN4 is connected to the output terminal XOUT, and the source terminal of transistor MN4 is connected to the input terminal XIN. The gate terminal of transistor MN4 is connected to the node between the drain terminal of diode MN3 and the current source MP3. If the current through the separate current path MP3, MN3, MN2 is high, the controllable resistor MN4 has a low resistance. This is the case in a transitional phase or during the ramp-up phase of the oscillator. If the current through the separate current path is low, the resistance of transistor MN4 is high, which is the case during normal, steady state operation of the oscillator.

In accordance with an embodiment of this disclosure, first and second diode devices MND2, MND3 are provided that have opposite orientation and that are connected between the output terminal XOUT and the input terminal XIN of the inverter. Both diode devices are realized as n-channel MOS transistors of which the gate and drain terminals are connected together. The gate and drain terminals of the first diode device MND2 are connected to the output terminal XIN, and the source terminal of diode device MND2 is connected to output terminal XOUT. The gate and drain terminals of the second diode MND3 are connected to output terminal XOUT, and the source terminal of diode device MND3 is connected to the input terminal XIN.

If a strong EMI event takes place, the oscillation of the circuit is likely to be disturbed. The EMI noise may impress the noise frequency on the oscillator circuit. When a strong interference signal due to a ballasted lighting device such as a fluorescent lamp is injected into the terminals XOUT and XIN or both, the AGC will reduce the drive level through reducing the amplification factor $g_m$ by reducing the current through the controllable current sources MP2, MP3. In the case of a persistent interference signal with long duration, the factor $g_m$ may be reduced to the point that the oscillator stops its oscillation. The AGC reacts in response to the noise impulse such that it reduces the current through the controllable current source MP2 and therefore through the inverter so that the oscillation may stop. In this case, at least one of the first and second MOS diodes MND2, MND3 will be conductive and will cause a current flowing between the input and the output XIN, XOUT of the inverter so that the oscillator quickly restarts again. During normal operation, however, the diode devices MND2, MND3 are switched off.

In yet another embodiment of the present disclosure, a third diode device MND1 is provided which is realized as an re-channel MOS transistor of which the gate and drain terminals are connected together. The gate and drain terminals of the third diode MND1 are connected to the node between the two series-connected diode devices MN2, MN3. The source of the third diode device MND1 is connected to the output terminal XOUT. During the startup phase, the signal at the output terminal XOUT will be limited to two forward diode voltages above ground potential GND through diode transistors MN2, MND1. It is to be noted that the terminal XOUT is shown twofold in the circuit diagram to simplify the structure of the circuit. In fact, the terminal XOUT exists only once in the circuit. Instead, both terminals labelled with XOUT could be connected by a wire.

During operation, the diode-connected transistors MND1, MND2, MND3 monitor the voltage at the terminals XOUT and XIN, and the voltage of diode MN2 is common to both terminals XIN, XOUT through the MOS resistor MN4, which is substantively conductive. These diodes oppose a big voltage change in these nodes and provide a fast stabilization of the signal at output terminal XOUT, once the electromagnetic interference event is removed. The amplitude of the oscillation is regulated, since the lower extremes of the sine wave of the oscillation are restrained to be equal to the voltage at the input terminal XIN minus the forward voltage of the diode MND2.

In the case that the voltage at terminal XIN is very low, the diode MND3 will be forward biased so that a current will flow from the output XOUT to the input XIN. Furthermore, if the output voltage at terminal XOUT is very low, the diode MND2 will be forward biased to provide a current into output terminal XOUT. The diode devices MND1, MND2, MND3 according to the present disclosure will only be active if the oscillation is not in the normal, steady state so that they do not consume power in normal operation mode. On the other hand, the AGC controls the controllable current sources MP2, MP3 to a low level in normal operation mode. In a transitional phase, at least one of the diodes MND1, MND2, MND3 will be forward biased so that the oscillation has a chance to restart and the AGC increases the current through controllable current sources MP2, MP3. The circuit can be designed for very low power operation in the steady state mode, while it has provisions to enhance the restart of the operation in the case of an EMI event.

Figure 3:
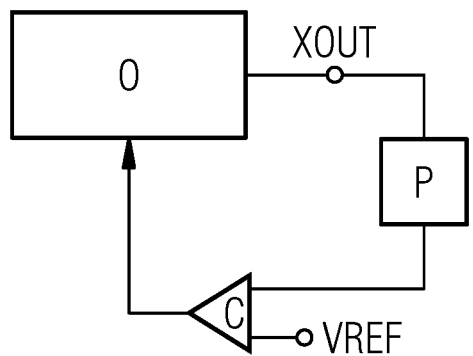
FIG. 3 shows a principle circuit diagram of an automatic gain control circuit.

FIG. 3 shows a principle diagram of the AGC circuit. A peak detector P is connected to the output terminal XOUT. The output signal of the peak detector is compared to a reference voltage VREF. The signal at the output of the comparator C is representative of the amplification factor $g_m$ and controls the current through the oscillator O. Other realizations of the AGC circuit apparent to a skilled person are also useful.

When the oscillator has not yet started up, the AGC behaves as a bias current reference circuit to provide the necessary start-up current for the Pierce core. At the start-up the $g_m$ is set to be higher than the required critical point to accelerate oscillation build-up. As the oscillation amplitude builds up, the reference current sourced by MP2 and controlled by the regulator is reduced until the AC voltage amplitude reaches a critical point where the loop gain approaches unity. At the stable oscillation condition, the oscillator is operating at the minimum current required to address the low power requirement.

Figure 4:
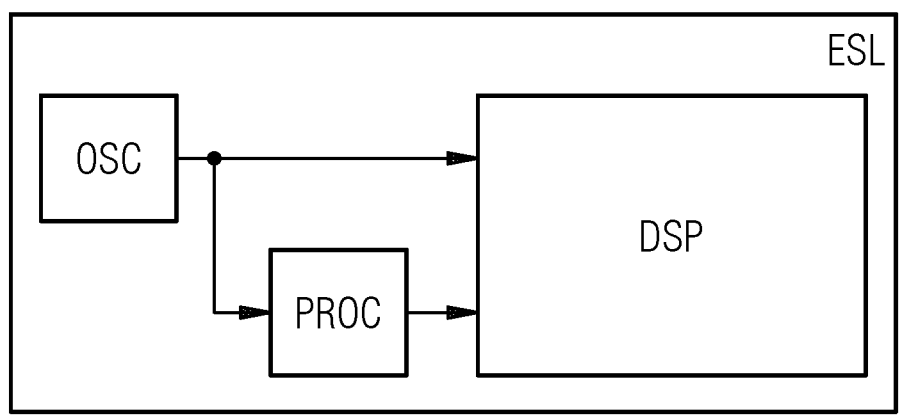
FIG. 4 shows a principle diagram of an electronic label incorporating an oscillator according to the present disclosure.

FIG. 4 describes a principle circuit diagram of an electronic equipment incorporating the oscillator of this disclosure. An electronic label for a shelf in a supermarket such as an electronic shelf label ESL is shown in FIG. 4. The electronic shelf label comprises a display DSP on which information is displayed, such as price information, price per kilogram information, quantity information, etc. The display may be a liquid crystal display (LCD) or may be of a reflective type. Usually, the display requires a refresh operation and is operated in a line-by-line sequence. The display is controlled by a clock time basis generated by the oscillator OSC. The time basis is used, for example, to control the line-by-line refresh operation of the display.

The information to be displayed is provided by a processor PROC. The processor is controlled by a clock signal also provided by the oscillator OSC.

The electronic shelf label is usually attached to the front edge of a shelf, often in the vicinity of a fluorescent lighting system that may also be attached to the shelf and that may become a great source of an EMI event to the neighboring shelf labels. Modern fluorescent lamps have electronic ballast circuits that typically operate in the range of about 20 kHz to about 120 kHz and may cause interference with the electronic shelf labels. An EMI event can couple such a strong noise into the oscillator circuit including electrically fast transients or high frequency interference signals so that the oscillator may drift from its ideal operation or may even end up in loss of oscillation. Conventional oscillators may risk ending in a situation where they never can recover oscillation.

The oscillator according to the present disclosure has first, second and third diode devices that provide for a fast recovery of oscillation after a stop of oscillation. With a suitable design of the device, the recovery time can be so quick that it is stable again before the end of the refresh interval so that the display of information will be not be disturbed.

The invention claimed is:

1. An oscillator circuit arrangement, comprising:
an inverter having an input terminal and an output terminal to be connected to a crystal device and having a supply terminal;

an automatic gain control device connected to the output terminal of the inverter and connected to a controllable current source that is connected to the supply terminal of the inverter; and a first diode device and a second diode device having different orientation and connected between the input and the output of the inverter, wherein the first diode device has a gate terminal and a drain terminal that are connected with each other and are connected to the input of the inverter and has a source terminal that is connected to the output of the inverter.

2. The oscillator circuit arrangement according to claim 1, further comprising a controllable resistor connected between the input and output terminals of the inverter and a current path comprising another controllable current source controlled by the output of the automatic gain control device, the current path controlling the controllable resistor.

3. The oscillator circuit arrangement according to claim 2, wherein the current path includes at least one resistive element (MN3, MN2) through which the controllable current source (MP3) of the current path is connected to a terminal for a ground potential (GND).

4. The oscillator circuit arrangement according to claim 3, wherein the at least one resistive element of the current path comprises a series connection of a first and a second diode device.

5. The oscillator circuit arrangement according to claim 4, further comprising a third diode device connected between one of the first and second diode devices of the resistive element of the current path and the output terminal of the inverter.

6. The oscillator circuit arrangement according to claim 5, wherein the third diode device comprises a MOS transistor of which the gate and drain terminals are connected with each other.

7. The oscillator circuit arrangement according to claim 2, wherein the first and second diode devices each comprise a MOS transistor of which the gate and drain terminals are connected with each other.

8. The oscillator circuit arrangement according to claim 4, wherein the first and second diode devices of the resistive element each comprise a MOS transistor of which the gate and drain terminals are connected with each other.

9. The oscillator circuit arrangement according to claim 6, wherein the MOS transistors of the first, second and third diode devices and the controllable resistor, in each case, are n-channel-MOS transistor.

10. The oscillator circuit arrangement according to claim 3, wherein the controllable current sources, in each case, are a p-channel-MOS transistor whose gate terminal is connected to the output of the automatic gain control device.

11. The oscillator circuit arrangement according to claim 1, wherein the second diode device has a gate terminal and a drain terminal that are connected with each other and are connected to the output of the inverter and has a source terminal that is connected to the input of the inverter.

12. The oscillator circuit arrangement according to claim 1, wherein the automatic gain control device generates an output signal that has a high gain close to the startup operational phase of the oscillator and has a low gain in the steady state operational phase of the oscillator.

13. The oscillator circuit arrangement according to claim 1,
wherein the oscillator circuit comprises a terminal for a supply potential,
wherein the controllable current source is connected to the terminal for a supply potential and the supply terminal of the inverter, the controllable current source having a control terminal,
wherein the automatic gain control device has an input terminal, connected to the output terminal of the inverter and an output terminal connected to the control terminal of the controllable current source,
wherein the first and second diode devices each comprise a MOS transistor having gate, drain and source terminals of which gate and drain terminals are connected with each other.

14. An electronic label device comprising a display device and the oscillator circuit arrangement comprising:

an inverter having an input terminal and an output terminal to be connected to a crystal device and having a supply terminal;

an automatic gain control device connected to the output terminal of the inverter and connected to a controllable current source that is connected to the supply terminal of the inverter; and a first diode device and a second diode device having different orientation and connected between the input and the output of the inverter, wherein the first diode device has a gate terminal and a drain terminal that are connected with each other and are connected to the input of the inverter and has a source terminal that is connected to the output of the inverter, wherein the oscillator circuit arrangement provides a clock signal to control display of information on the display device.

15. An oscillator circuit arrangement, comprising:

an inverter having an input terminal and an output terminal to be connected to a crystal device and having a supply terminal;

an automatic gain control device connected to the output terminal of the inverter and connected to a controllable current source that is connected to the supply terminal of the inverter; and first and second diode devices having different orientation and connected between the input and the output of the inverter, wherein the second diode device has a gate terminal and a drain terminal that are connected with each other and are connected to the output of the inverter and has a source terminal that is connected to the input of the inverter.

16. The oscillator circuit arrangement according to claim 15, further comprising a controllable resistor connected between the input and output terminals of the inverter and a current path comprising another controllable current source controlled by the output of the automatic gain control device, the current path controlling the controllable resistor.

17. The oscillator circuit arrangement according to claim 16, wherein the current path includes at least one resistive element (MN3, MN2) through which the controllable current source (MP3) of the current path is connected to a terminal for a ground potential (GND).

18. The oscillator circuit arrangement according to claim 17, wherein the at least one resistive element of the current path comprises a series connection of a first and a second diode device.

19. The oscillator circuit arrangement according to claim 18, further comprising a third diode device connected between one of the first and second diode devices of the resistive element of the current path and the output terminal of the inverter.

20. The oscillator circuit arrangement according to claim 19, wherein the third diode device comprises a MOS transistor of which the gate and drain terminals are connected with each other.

21. The oscillator circuit arrangement according to claim 16, wherein the first and second diode devices each comprise a MOS transistor of which the gate and drain terminals are connected with each other.

22. The oscillator circuit arrangement according to claim 19, wherein the first and second diode devices of the resistive element each comprise a MOS transistor of which the gate and drain terminals are connected with each other.

23. The oscillator circuit arrangement according to claim 20, wherein the MOS transistors of the first, second and third diode devices and the controllable resistor, in each case, are n-channel-MOS transistor.

24. The oscillator circuit arrangement according to claim 17, wherein the controllable current sources, in each case, are a p-channel-MOS transistor whose gate terminal is connected to the output of the automatic gain control device.

25. The oscillator circuit arrangement according to claim 15, wherein the first diode device has a gate terminal and a drain terminal that are connected with each other and are connected to the input of the inverter and has a source terminal that is connected to the output of the inverter.

26. The oscillator circuit arrangement according to claim 15, wherein the automatic gain control device generates an output signal that has a high gain close to the startup operational phase of the oscillator and has a low gain in the steady state operational phase of the oscillator.

27. The oscillator circuit arrangement according to claim 15, wherein the oscillator circuit comprises a terminal for a supply potential,
wherein the controllable current source is connected to the terminal for a supply potential and the supply terminal of the inverter, the controllable current source having a control terminal,
wherein the automatic gain control device has an input terminal, connected to the output terminal of the inverter and an output terminal connected to the control terminal of the controllable current source,
wherein the first and second diode devices each comprise a MOS transistor having gate, drain and source terminals of which gate and drain terminals are connected with each other.

28. An electronic label device comprising a display device and the oscillator circuit arrangement comprising:
an inverter having an input terminal and an output terminal to be connected to a crystal device and having a supply terminal;
an automatic gain control device connected to the output terminal of the inverter and connected to a controllable current source that is connected to the supply terminal of the inverter; and
a first diode device and a second diode device having different orientation and connected between the input and the output of the inverter, wherein the second diode device has a gate terminal and a drain terminal that are connected with each other and are connected to the output of the inverter and has a source terminal that is connected to the input of the inverter,
wherein the oscillator circuit arrangement provides a clock signal to control display of information on the display device.

* * * * *